(12) United States Patent
Kauffman et al.

(10) Patent No.: US 6,274,902 B1
(45) Date of Patent: *Aug. 14, 2001

(54) NONVOLATILE FLOATING GATE MEMORY WITH IMPROVED INTERPOLY DIELECTRIC

(75) Inventors: Ralph Kauffman; Roger Lee, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/596,018

(22) Filed: Jun. 14, 2000

Related U.S. Application Data

(60) Continuation of application No. 08/977,868, filed on Nov. 25, 1997, now Pat. No. 6,177,311, which is a division of application No. 08/634,118, filed on Apr. 17, 1996, now Pat. No. 5,780,891, which is a continuation-in-part of application No. 08/349,745, filed on Dec. 5, 1994, now abandoned.

(51) Int. Cl.⁷ .................................................. H01L 29/788
(52) U.S. Cl. ............................................ 257/316; 257/324
(58) Field of Search ..................................... 257/316, 324

(56) References Cited

U.S. PATENT DOCUMENTS

| | | | |
|---|---|---|---|
| 4,438,157 | 3/1984 | Romano-Moran | 438/762 |
| 4,613,956 | 9/1986 | Paterson et al. | 365/185 |
| 4,618,541 | 10/1986 | Forouhi et al. | 257/640 |
| 4,697,330 | 10/1987 | Paterson et al. | 437/42 |
| 4,937,756 | 6/1990 | Hsu et al. | 364/490 |
| 4,980,307 | 12/1990 | Ito et al. | 437/40 |
| 5,010,024 | 4/1991 | Allen et al. | 437/24 |
| 5,063,431 | 11/1991 | Ohshima | 357/54 |
| 5,256,584 | 10/1993 | Hartmann | 437/43 |
| 5,306,936 | 4/1994 | Goto | 257/324 |
| 5,414,287 | 5/1995 | Hong | 438/259 |
| 5,674,788 | 10/1997 | Wristers et al. | 438/301 |
| 5,780,891 | * 7/1998 | Kauffman et al. | 257/316 |
| 6,157,059 | * 12/2000 | Kauffman et al. | 257/316 |
| 6,177,311 | * 1/2001 | Kauffman et al. | 438/257 |

OTHER PUBLICATIONS

P. Burkhardt, "Composite Silicon Dioxide–Silicon Oxynitride Insulating Layer," IBM Tech. Discl. Bull., vol. 13, #1, Jun. 1970. p. 21.

A. Sassala et al., silicon oxynitride study by the tetrahedron model and by spectroscopic ellipsometry, Journal of Non–Crystalline Solids vol. 187, pp. 396–402.

S. Lim et al., Inhomogeneous dielectric grown by plasma–enhanced chemical vapor deposition, Thin Solid Films, vol. 236 (1993), pp. 64–66.

* cited by examiner

Primary Examiner—Olik Chaudhuri
Assistant Examiner—William David Coleman
(74) Attorney, Agent, or Firm—Ormiston & McKinney, PLLC

(57) ABSTRACT

A floating memory device utilizing a composite oxide/oxynitride or oxide/oxynitride/oxide interpoly dielectric.

23 Claims, 4 Drawing Sheets

NONVOLATILE FLOATING GATE MEMORY WITH IMPROVED INTERPOLY DIELECTRIC

CROSS REFERENCE TO RELATED APPLICATIONS

This is a continuation of U.S. application Ser. No. 08/977,868 filed Nov. 25, 1997, now U.S. Pat. No. 6,177,311 which is a divisional of U.S. application Ser. No. 08/634,118 filed Apr. 17, 1996, now U.S. Pat. No. 5,780,891, which is a continuation-in-part of U.S. application Ser. No. 08/349,745 filed Dec. 5, 1994, now abandoned.

FIELD OF THE INVENTION

The invention relates generally to nonvolatile floating gate memory devices and, more specifically, to an improved interpoly dielectric for floating gate memory devices and associated fabrication processes.

BACKGROUND OF THE INVENTION

Floating gate memory devices, such as Erasable Programmable Read Only Memory (EPROM), Electrically Erasable Programmable Read Only Memory (EEPROM) and Flash EPROMs or EEPROMs, are widely used for nonvolatile memories. These devices store charges in a floating gate. The floating gate must hold a charge without refresh for extended periods. The floating gate is charged by hot electron or avalanche injection through a gate oxide between the floating gate and the substrate. Typically, a first layer of polysilicon is used for the floating gate, which is a totally encapsulated and electrically isolated portion of polysilicon. The control gate is formed over the floating gate in a second layer of polysilicon. The floating and control gates are separated by an interpoly dielectric and act as two plates of a capacitor. Transistor source and drain regions are formed below and adjacent to the floating gate.

For a flash cell, the floating gate may be charged by applying a relatively large voltage to the control gate. The voltage on the control gate establishes an electric field in the gate oxide between the floating gate and the substrate. Then a lower voltage pulse is applied between source and drain regions in the substrate. The electric field attracts the electrons generated from the "avalanche" breakdown of the transistor due to the drain and control gate voltages and injects those electrons into the floating gate through the gate oxide. This process of injection charging is referred to as hot electron or avalanche injection.

As the cell spacing of floating gate memory devices is reduced, a very high quality interpoly dielectric is needed to maintain high specific capacitance between the floating gate and the control gate. This dielectric must perform effectively during the application of high charging voltages and also prevent leakage between the floating gate and the control gate after charging. Since information is stored without refresh by charges trapped in the floating gate, it is critical that leakage between the floating gate and the control gate be minimized.

For standard Metal Oxide Silicon (MOS) processes, forming a precision capacitor over a first layer of polysilicon is difficult since the surface of the polysilicon is not as smooth as that of the polished surface of the substrate. The unevenness of the polysilicon can significantly affect the thickness of an oxide insulator formed over the polysilicon. Variations in thickness of an oxide leads to corresponding variations in the specific capacitance between the gates.

U.S. Pat. No. 4,613,956 issued to Patterson et al. on Sep. 23, 1986 presents one solution to the above-referenced problems. Patterson describes an integrated insulating dielectric comprising a composite oxide/nitride or oxide/nitride/oxide dielectric insulator used over the. first layer of polysilicon instead of the thermally grown oxide previously used. The composite dielectric disclosed in Patterson has come to be commonly referred to as an "ONO" film stack. The present invention provides an alternative and equally effective interpoly dielectric to the ONO film stack described in Patterson.

SUMMARY OF THE INVENTION

One object of the invention is to provide a floating gate memory having a high specific capacitance between the floating gate and the control gate, even at reduced cell spacing on the order of 1.0 micron.

It is another object of the invention to provide floating gate memory in which the specific capacitance and leakage resistance between the floating gate and the control gate is very high.

It is another object of the invention to provide a method for fabricating a floating gate memory in which the interpoly dielectric has a uniform thickness.

According to the present invention, these and other objects and advantages are achieved by a floating gate memory device utilizing a composite oxide/oxynitride or oxide/oxynitride/oxide interpoly dielectric. The dielectric comprises a layer of silicon dioxide and a discrete layer of silicon oxynitride formed on the layer of silicon dioxide. Alternatively, the intergate dielectric comprises a layer of silicon dioxide formed over the layer of oxynitride to form a composite oxide/oxynitride/oxide film stack. The composite oxide/oxynitride film stack allows for high specific capacitance and high leakage resistance between the floating gate and the control gate. Another aspect of the invention provides a method of fabricating a floating gate memory device incorporating the oxide/oxynitride interpoly dielectric. The method comprises the steps of: (1) forming a floating gate; (2) forming a control gate over the floating gate; and (3) forming a dielectric between the floating gate and the control gate. The step of forming the dielectric includes forming a discrete layer of silicon oxynitride on a layer of silicon dioxide.

The oxynitride used in the present invention is itself a separate and distinct compound. For instance, some processes oxidize the silicon nitride and this oxidized film is referred to as oxynitride. In the present invention, by contrast, the oxynitride film is a separate and distinct compound deposited over the underlying layer of silicon dioxide. In that aspect of the invention having a composite three stack film, the second layer of silicon dioxide is formed directly over the silicon oxynitride The use of oxynitride as an alternative to nitride results in comparable performance. Nitride has a refractory index of approximately 2.0 while oxynitride has a refractory index in the range of 1.84 to 1.95.

Other objects, advantages and novel features of the invention will become apparent to those skilled in the art upon examination of the following detailed description or may be learned by practice of the invention. The objects and advantages of the invention may be realized and achieved by means of the instrumentalities and combinations particularly pointed out in the appended claims.

The drawings are not actual views of the portions of the semiconductor device depicted therein, but are schematic representations intended only to illustrate the structure and processes of our invention.

DETAILED DESCRIPTION OF THE INVENTION

The present invention will be described in terms of Metal Oxide Semiconductor (MOS) technology which is currently the most commonly used integrated circuit technology. The invention, however, may be used in other integrated circuit technologies. MOS integrated circuits are typically formed with a lightly doped P-type silicon substrate or a lightly doped N-type silicon substrate. The present invention will be described using lightly doped P-type silicon as the starting material, although the invention may be implemented with other substrate materials. If other substrate materials are used, then there may be corresponding differences in some materials and structure as is well known in the art.

The formation of integrated circuits includes photolithographic masking and etching. This process consists of creating a photolithographic mask containing the pattern of the component to be formed, coating the water with a light-sensitive material called photoresist, exposing the photoresist coated wafer to ultra-violet light through the mask to soften or harden parts of the photoresist, depending on whether positive or negative photoresist is used, removing the softened parts of the photoresist, etching to remove the materials left unprotected by the photoresist and stripping the remaining photoresist. This photolithographic masking and etching process is referred to herein as "patterning and etching."

Figure 1:
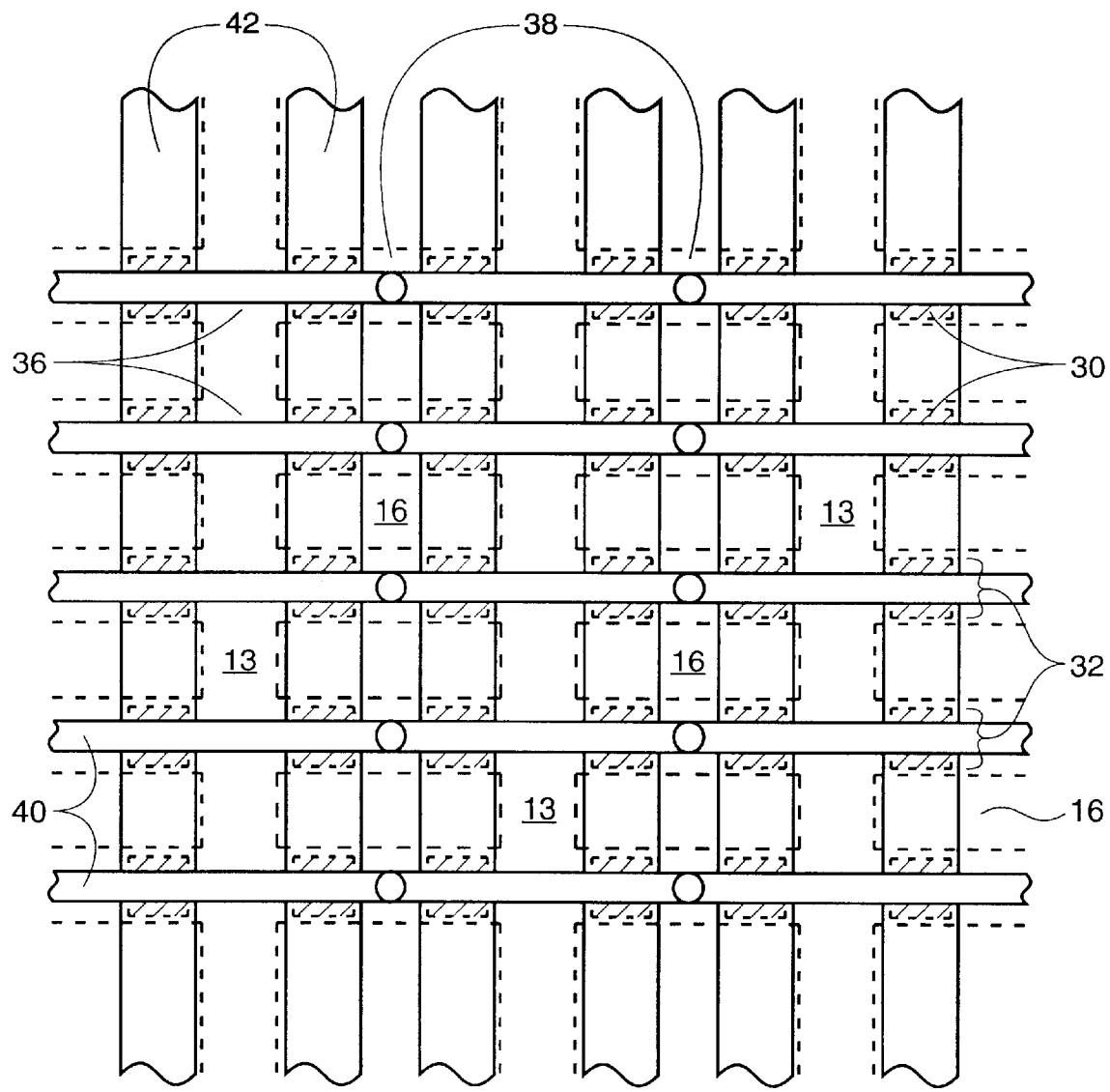
FIG. 1 is a plan view of a floating gate memory into which the present invention may be incorporated.

FIG. 1 is a plan view illustrating a floating gate memory into which the present invention may be incorporated. FIG. 1 shows transistor source regions 36, transistor drain regions 38, bit lines 40, floating gates 30 and word lines 42. Word lines 42 form control gates 32 where they pass over floating gates 30. The dotted lines in FIG. 1 define active areas 13 and field oxide regions 16.

Figure 2:
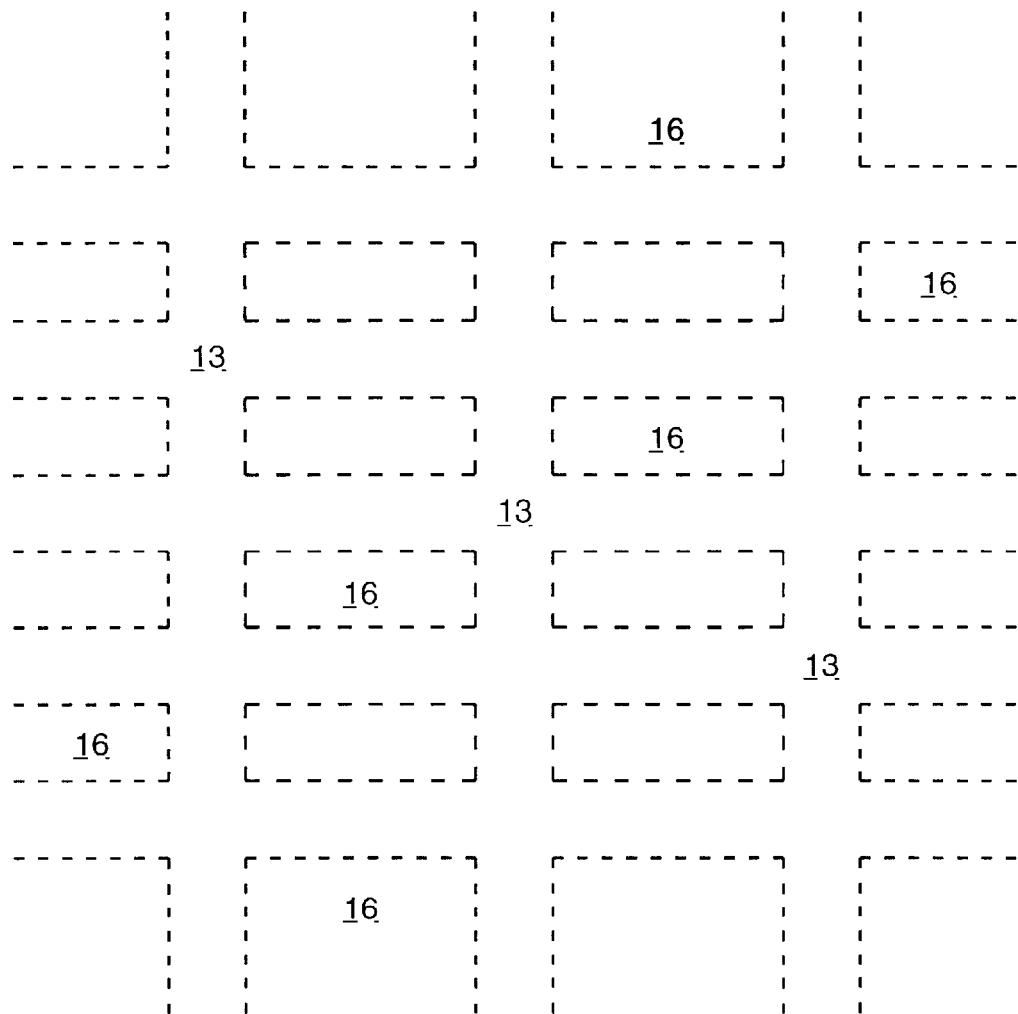
FIG. 2 is a plan view of the pattern defined by the gate oxide (active areas) and the field oxide regions of a floating gate memory.
Figure 3:
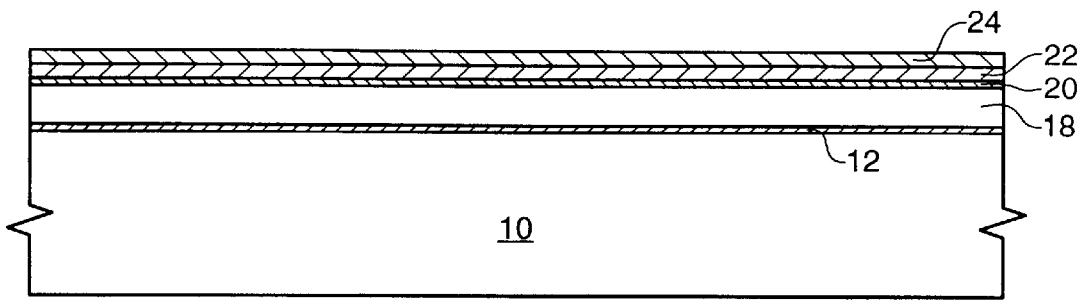
FIGS. 3–8 are cross sections of a portion of a floating gate memory at various stages of formation illustrating the preferred embodiment of the invention.

Referring to FIGS. 2 and 3, lightly doped P-type monocrystalline silicon substrate 10 is oxidized to form a pad oxide (not shown). A layer of nitride (not shown) is formed in a crisscross pattern on the pad oxide to define active areas 13. Field oxide regions 16 are formed in the exposed portions of the pad oxide. The unexposed portions of the pad oxide become gate oxide 12. The nitride layer is then removed. Gate oxide 12 and field oxide regions 16 are formed by conventional means well known in the art.

Figure 4:
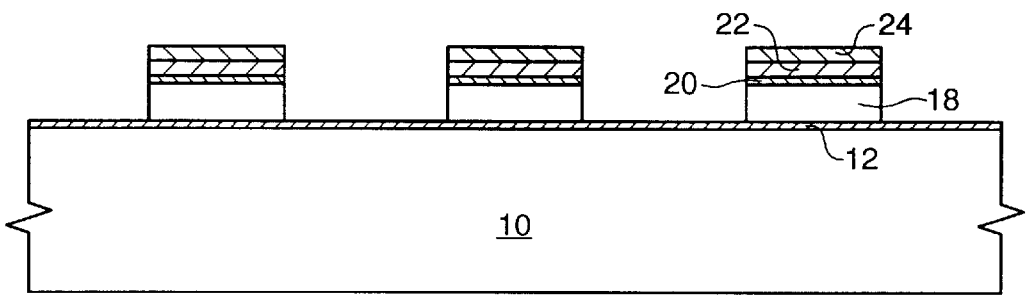

Referring to FIGS. 3 and 4, first polysilicon layer 18 is deposited using Chemical Vapor Deposition (CVD) or other suitable process to a thickness of approximately 2,000 angstroms. First polysilicon layer 18 is doped to the desired level through phosphorous diffusion. Floating gate 30 will be formed in first polysilicon layer 18. First silicon dioxide layer 20 is thermally grown on first polysilicon layer 18 to a thickness of approximately 130 angstroms. Alternatively, first silicon dioxide layer 20 may be deposited on first polysilicon layer 18 by CVD. Typically, the doping level of first polysilicon layer 18 is low and, therefore, the thermal growth of first silicon dioxide layer 20 is preferred to CVD deposition to provide better uniformity of thickness.

Using Low Pressure Chemical Vapor Deposition (LPCVD), oxynitride layer 22 is deposited over first silicon dioxide layer 20. Preferably, oxynitride layer 22 is deposited to a thickness of 50 to 300 angstroms, most preferably about 150 angstroms. The preferred oxynitride deposition parameters include 15–55 standard cubic centimeters per minute (sccm) dichlorosilane, 50–150 sccm ammonia, 25–75 sccm nitrous oxide and 0–90 sccm of nitrogen at a pressure in the range of 100–350 millitorr and a temperature in the range of 600° C. –800° C. The most preferred oxynitride deposition parameters include approximately 35 standard cubic centimeters per minute (sccm) dichlorosilane, 100 sccm ammonia, 50 sccm nitrous oxide and 60 sccm of nitrogen at a pressure of 235 millitorr and a temperature of 680° C. The preferred deposition rate is 0.5–20 angstroms per minute, most preferably about 1.5 angstroms per minute. The deposition of oxynitride at this thickness and under these conditions will result in a refractory index of between 1.84 and 1.95 which is sufficient to provide high dielectric capacitance and leakage resistance. By comparison, the refractory index of the similar use of a nitride film is 2.0. Hence, the use of the oxynitride film provides an acceptable substitute to the nitride film currently being used in many applications.

In the preferred embodiment of the invention, second silicon dioxide layer 24 is thermally grown on oxynitride layer 22 to a thickness of approximately 50 angstroms. Alternatively, second silicon dioxide layer 24 may be deposited on oxynitride layer 22 by CVD. First polysilicon layer 18, first silicon dioxide layer 20, oxynitride layer 22 and second silicon dioxide layer 24 are patterned and etched in rows perpendicular to the line of source regions 36 (see FIG. 1) as shown by comparing FIGS. 3 and 4.

The composite two or three layer film stacks will have a total thickness of 100 to 400 angstroms equivalent oxide thickness. Due to the difficulty in directly measuring the thickness of the film stack, the total thickness of the composite film stack is typically described in terms of an equivalent oxide thickness. The equivalent oxide thickness of the composite film stack is computed from the measured capacitance of the film stack and the known material dielectric constants, as is well known in the art. For example, the three layer oxide/oxynitride/oxide composite film stack of the preferred embodiment having a total thickness of 330 angstroms (first oxide layer 130 angstroms, oxynitride layer 150 angstroms and second oxide layer 50 angstroms) has an equivalent oxide thickness of approximately 250 angstroms.

Figure 5:
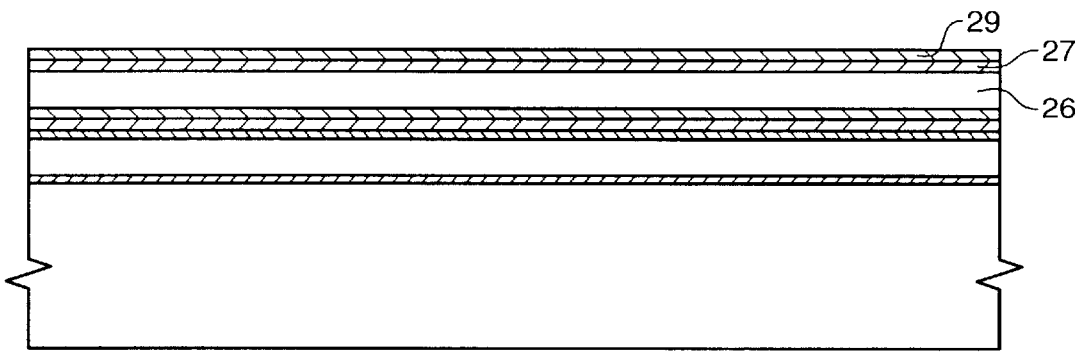
Figure 6:
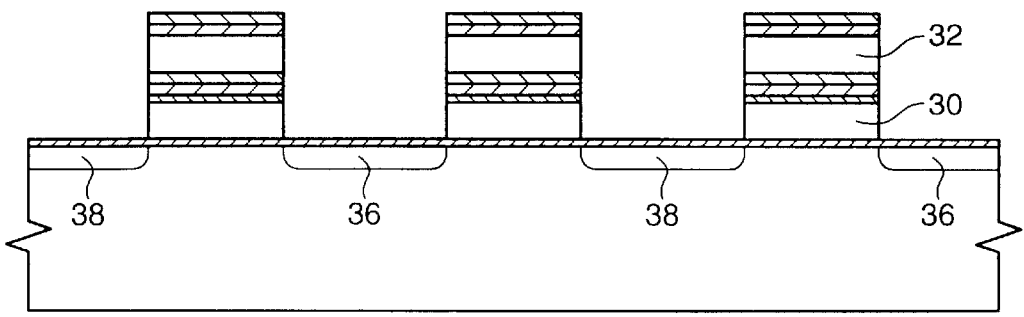

Referring to FIG. 5, second polysilicon layer 26 is then deposited to a thickness of approximately 2,000 angstroms. Second polysilicon layer 26 is doped to the desired level through phosphorous diffusion. Optionally, metal silicide layer 27 and first oxide insulator 29 may be formed over second polysilicon layer 26. The structure formed is then patterned and etched in columns perpendicular to the rows of first polysilicon layer 18 to expose active areas 13 and to form floating gate 30 and control gate 32 as shown in FIG. 6. Source region 36 and drain region 38 are formed by ion implanting N-type impurities in the exposed portions of the substrate.

Figure 7:
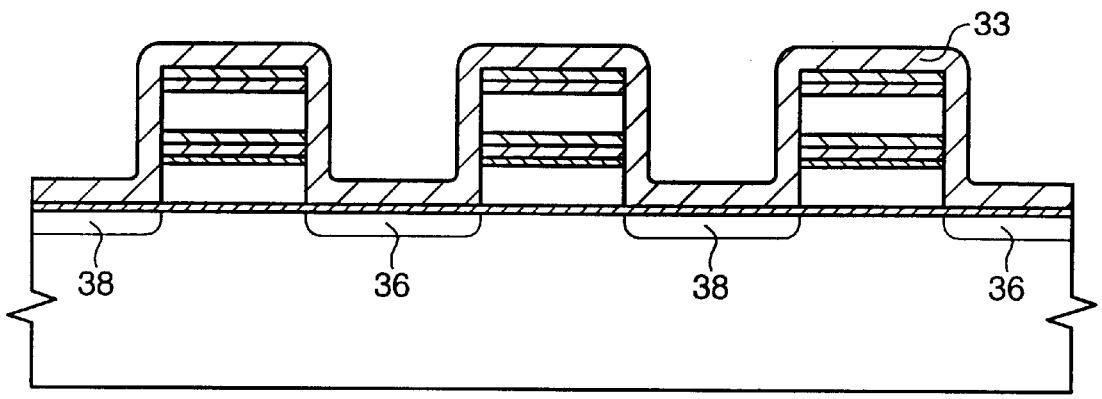
Figure 8:
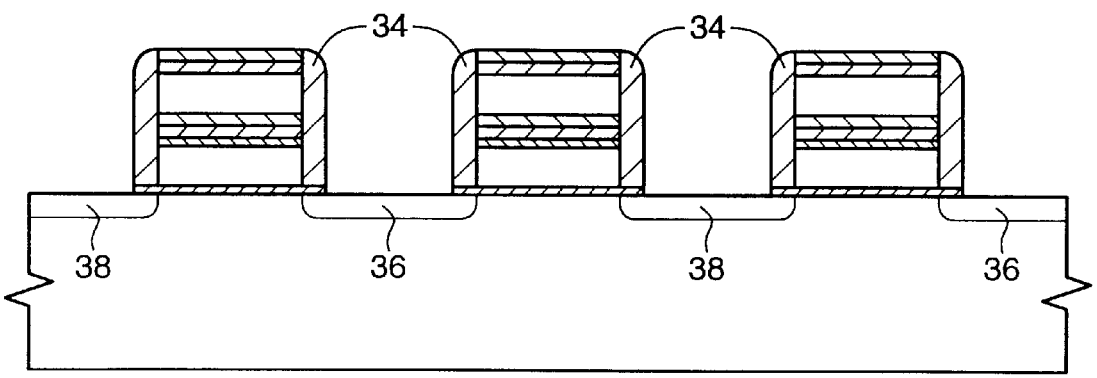

Referring to FIG. 7, an optional second oxide insulator 33 is formed, patterned and etched to form oxide spacers 34 as shown in FIG. 8. During this spacer etch, the gate oxide 12 exposed at active area 13 is removed. Source region 36 and drain region 38 may also be formed after the formation of oxide spacers 34. Preferably, source region 36 and drain region 38 are formed before the formation of oxide spacers 34 to allow for additional overlap of the source and drain regions under oxide spacers 34.

Processing continues with bit line contact etching and metallization steps to form a functional, complete integrated circuit. Such further steps are conventional and well known in the art.

The present invention has been described with reference to a floating gate memory having cell spacing as measured by the width of the floating gate (channel area) of approximately 0.1 micron. This type of memory would operate utilizing a charging voltage of approximately 12 volts applied to the control gate and a pulse voltage of approximately 5 volts applied to the drain. Scaling to other cell spacing and charging voltages, resulting in different component thicknesses and other such variations, would be obvious to one skilled in the art.

The present invention provides an effective alternative to the current device structure and fabrication methods using oxide/nitride interpoly dielectric. The use of an oxide/oxynitride film stack in the present invention provides a similarly high capacitance and high leakage resistance interpoly dielectric. The particular embodiments shown in the drawings and described herein are for purposes of example and should not be construed to limit the invention as set forth in the appended claims. Those skilled in the art may now make numerous uses and modifications of the specific embodiments described without departing from the scope of the invention. The process steps described may in some instances be performed in a different order and/or equivalent structures and processes may be substituted for the various structures and processes described.

What is claimed is:

1. A dielectric stack for a transistor including an electrode, the stack comprising:
    a first oxide over the electrode of the transistor;
    an oxynitride over the first oxide; and
    a second oxide over the oxynitride.

2. The stack in claim 1, wherein the first oxide is a generally nitrogen-free oxide.

3. The stack in claim 2, wherein the second oxide is a generally nitrogen-free oxide.

4. An insulator for a semiconductor device including a first conductive element and a second conductive element opposing the first conductive element, the insulator comprising:
    a first oxide proximate the first conductive element of the semiconductor device;
    a second oxide proximate the second conductive element; and
    an oxynitride between the first oxide and the second oxide.

5. The insulator in claim 4, wherein the oxynitride contacts the first oxide.

6. The insulator in claim 5, wherein:
    the first oxide is between the first conductive element and the second conductive element; and
    the second oxide is between the first conductive element and the second conductive element.

7. A dielectric component for a memory device including an oxide layer, the component comprising an oxynitride layer on the oxide layer of the memory device, wherein the oxynitride layer is distinct from the oxide layer.

8. An insulator for conductive gates of a memory device, the insulator comprising:
    a first layer over one of the conductive gates of the memory device, the first layer comprising oxygen and generally lacking nitrogen;
    a second layer over the first layer, the second layer comprising oxygen and nitrogen; and
    a third layer over the second layer, the third layer comprising oxygen and generally lacking nitrogen.

9. The insulator in claim 8, wherein the second layer comprises silicon.

10. The insulator in claim 9, wherein the first layer comprises silicon.

11. The insulator in claim 10, wherein the third layer comprises silicon.

12. A memory device, comprising:
    a first conductive element of the memory device;
    an insulative composite over the first conductive element, the insulative composite comprising:
        a plurality of oxide layers, and
        an oxynitride between at least two layers of the plurality of oxide layers, wherein the oxynitride is distinct from at least one of the two layers; and
    a second conductive element over the insulative composite.

13. The memory device in claim 12, wherein the first conductive element comprises polysilicon.

14. The memory device in claim 13, wherein the second conductive element comprises polysilicon.

15. A charge storage device, comprising:
    a first conductor serving as a component of the charge storage device;
    an oxide/oxynitride/oxide stack next to the first conductor; and
    a second conductor next to the stack.

16. The device in claim 15, wherein the first conductor is a transistor gate.

17. The device in claim 16, wherein the first conductor is a floating gate.

18. The device in claim 17, wherein the floating gate defines a width of about 1 micron.

19. The device in claim 17, further comprising a channel area defining a width of about 1 micron.

20. A dielectric component for a transistor including oxide between two transistor gates, the component comprising an oxynitride between at least two portions of the oxide of the transistor.

21. The dielectric component in claim 20, wherein the oxynitride is a component of a non-volatile memory device.

22. The dielectric component in claim 21, wherein the oxynitride is a component of a device selected from an EPROM and an EEPROM.

23. The dielectric component in claim 22, wherein the oxynitride is a component of a flash device.

* * * * *